United States Patent
Yamamoto et al.

(10) Patent No.: US 7,859,077 B2
(45) Date of Patent: Dec. 28, 2010

(54) SEMICONDUCTOR DEVICE

(75) Inventors: Kazushige Yamamoto, Kanagawa-ken (JP); Tatsuo Shimizu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 357 days.

(21) Appl. No.: 11/937,730

(22) Filed: Nov. 9, 2007

(65) Prior Publication Data

US 2008/0237667 A1     Oct. 2, 2008

(30) Foreign Application Priority Data

Mar. 30, 2007   (JP) ............... 2007-091474

(51) Int. Cl.
*H01L 31/06* (2006.01)
(52) U.S. Cl. ............... 257/462; 257/291; 257/E27.132
(58) Field of Classification Search ........... 257/292, 257/291, 458, 443, 461–462, E27.132–E27.133, 257/E27.188
See application file for complete search history.

(56) References Cited

U.S. PATENT DOCUMENTS 7,453,132 B1 * 11/2008 Gunn et al. ............. 257/448

2007/0114584 A1 * 5/2007 Jerdev et al. ............. 257/292

FOREIGN PATENT DOCUMENTS

JP      6-209119      7/1994

* cited by examiner

*Primary Examiner*—Matthew W Such
*Assistant Examiner*—Ali Naraghi
(74) *Attorney, Agent, or Firm*—Oblon, Spivak, McClelland, Maier & Neustadt, L.L.P.

(57) ABSTRACT

A semiconductor device includes: an n-type MOS transistor and a p-type MOS transistor connected in series; and a first gate extending via an insulating film above a channel of the n-type MOS transistor and a channel of the p-type MOS transistor. By providing light to the first gate, electrons and holes are generated, at least one of either of the electrons and holes passes through above the channel of the n-type MOS transistor and at least one of the either of the electrons and holes passes through above the channel of the p-type MOS transistor, whereby the n-type MOS transistor and the p-type MOS transistor are switched.

15 Claims, 20 Drawing Sheets

| LIGHT | VOLTAGE |
|---|---|
| 0 | 1 |
| 1 | 0 |

LIGHT OFF 0 / PMOS ON, NMOS OFF / OUTPUT 1

LIGHT ON 1 / PMOS OFF, NMOS ON / OUTPUT 0

LIGHT OFF 0 / PMOS ON, NMOS OFF / OUTPUT 1

| LIGHT | VOLTAGE |
|-------|---------|
| 0 | 0 |
| 1 | 1 |

LIGHT OFF 0 / PMOS OFF, NMOS ON / OUTPUT 0

LIGHT ON 1 / PMOS ON, NMOS OFF / OUTPUT 1

LIGHT OFF 0 / PMOS OFF, NMOS ON / OUTPUT 0

US 7,859,077 B2

SEMICONDUCTOR DEVICE

CROSS-REFERENCE TO RELATED APPLICATIONS

This application is based upon and claims the benefit of priority from the prior Japanese Patent Application No. 2007-091474, filed on Mar. 30, 2007; the entire contents of which are incorporated herein by reference.

BACKGROUND OF THE INVENTION

1. Field of the Invention

This invention relates to a semiconductor device for clocking a CMOS (complementary metal-oxide semiconductor) or other device.

2. Background Art

Recently, there has been an accelerating demand for enhancing the speed of LSI (large scale integrated circuit) and reducing its power consumption. With regard to speed enhancement, electric interconnection delay is becoming a crucial factor hindering the speed enhancement of LSI. This has triggered growing needs for optically driving a circuit, and activated research and development of on-chip optical interconnection and optoelectric hybrid LSI based thereon.

Core elements in an optoelectric hybrid LSI include a light emitting element for outputting an optical signal, an optical waveguide for transmitting an optical signal, and a light receiving element for receiving an optical signal. The circuit function differs depending on whether the light emitting element and the light receiving element reside inside or outside the LSI chip.

More specifically, an optoelectric hybrid LSI needs to include a light receiving element within the chip, thereby enabling optical clocking. Further providing a light emitting element within the chip also enables optical input/output and optical computation, which are conventionally believed difficult to realize.

Providing a light receiving element within the chip enables fast optical clocking. However, if the optoelectric conversion in optical clocking is based on current conversion, there is a problem of very high power consumption.

In this respect, JP-A 6-209119(Kokai) discloses a semiconductor device based on voltage conversion of light. More specifically, in the semiconductor device disclosed in JP-A 6-209119(Kokai), a photodiode is connected to the gate of a CMOS, and the channel of the CMOS is turned on by optically generated carriers.

However, the semiconductor device disclosed in JP-A 6-209119(Kokai) has no mechanism for eliminating optical carriers accumulated in the gate of the CMOS, and hence it cannot be turned off.

SUMMARY OF THE INVENTION

According to an aspect of the invention, there is provided a semiconductor device including: an n-type MOS transistor and a p-type MOS transistor connected in series; and a first gate extending via an insulating film above a channel of the n-type MOS transistor and a channel of the p-type MOS transistor, by providing light to the first gate, electrons and holes being generated, at least one of either of the electrons and holes passing through above the channel of the n-type MOS transistor and at least one of the either of the electrons and holes passing through above the channel of the p-type MOS transistor, whereby the n-type MOS transistor and the p-type MOS transistor being switched.

According to another aspect of the invention, there is provided a semiconductor device including: a plurality of transistor pairs, each transistor pair including an n-type MOS transistor and a p-type MOS transistor connected in series; and a first gate extending via an insulating film above channels of the n-type MOS transistors and channels of the p-type MOS transistors of the plurality of transistor pairs, when a current pulse is provided to the first gate, one of an electron and a hole passing through above the channels of the n-type MOS transistors and the one of the electron and hole passing through above the channels of the p-type MOS transistors of the plurality of transistor pairs, whereby the n-type MOS transistors and the p-type MOS transistors being successively switched.

DETAILED DESCRIPTION OF THE INVENTION

Embodiments of the invention will now be described in detail with reference to the drawings.

Figures 1A, 1B:
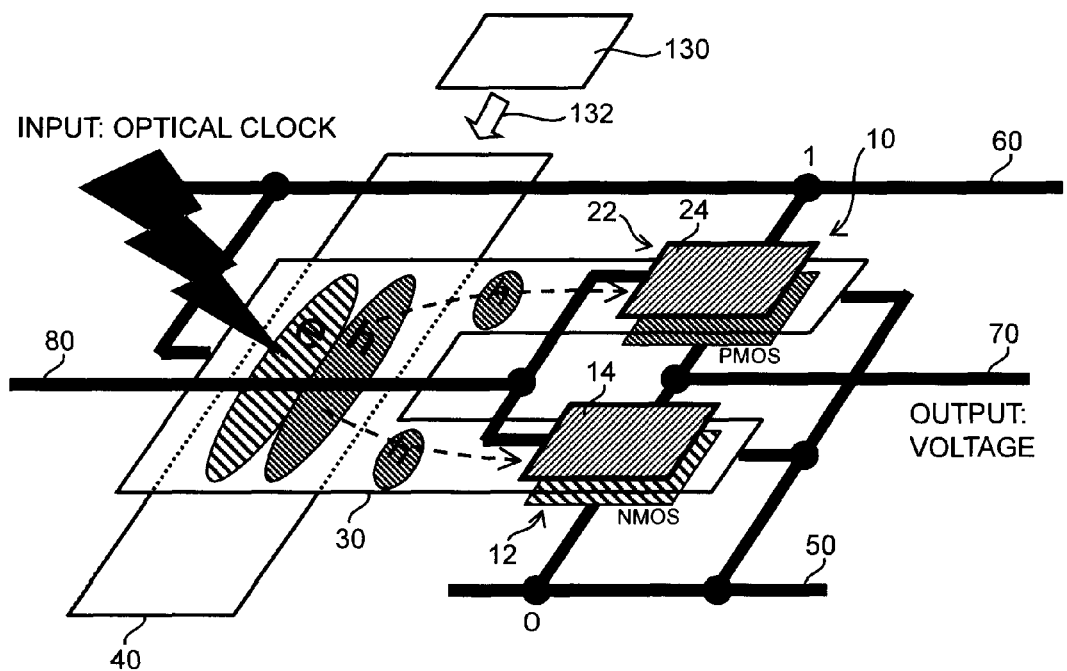
FIG. 1A is a conceptual diagram showing a semiconductor device according to a first embodiment of the invention.
FIG. 1B is a state transition table showing the operation of the semiconductor device.

FIG. 1A is a conceptual diagram showing a semiconductor device according to a first embodiment of the invention. FIG. 1B is a state transition table showing the operation of this semiconductor device.

The semiconductor device comprises a CMOS 10, a first gate 30, and an optical waveguide 40. The CMOS 10 includes an NMOS (N-type MOS) channel 12 and a PMOS (P-type MOS) channel 22. These channels 12, 22 are series connected between a low-level (e.g. 0 volts) interconnect 50 and a high-level (e.g. 1 volt) interconnect 60. An output interconnect 70 is connected to the junction between the NMOS channel 12 and the PMOS channel 22 and serves to output a signal voltage from the CMOS 10.

The first gate 30 extends above the NMOS channel 12 and the PMOS channel 22 across an insulating film, not shown. That is, the first gate 30 serves as a gate above each of these channels 12, 22. One end of the first gate 30 is connected to the low-level interconnect 50, and the other end is connected to the high-level interconnect 60. As described later in detail, the ends of the first gate 30 may be connected to interconnects other than the low-level interconnect 50 and the high-level interconnect 60, respectively, for application of a bias different from that of the low-level interconnect 50 and the high-level interconnect 60.

The optical waveguide 40 is provided close to or in contact with the first gate 30. That is, the first gate 30 has a distributed coupling or direct coupling to the optical waveguide 40, and can receive light propagating in the optical waveguide 40. Furthermore, the first gate 30 has an optoelectric conversion function. That is, the first gate 30 absorbs light and generates electrons and holes.

For example, a optical clock signal supply 130 supplies optical clock signal 132 to the optical waveguide 40. the first gate 30 absorbs the optical clock signal 132 and generates electrons and holes. The optical clock signal supply 130 may be provided as a part of the semiconductor device, alternatively, the optical clock signal supply 130 may be provided separately from the semiconductor device.

Above the NMOS channel 12 and the PMOS channel 22 and further above the first gate 30, second gates 14, 24 are provided across an insulating film, not shown. The second gates 14, 24 are connected to a gate interconnect 80.

The NMOS channel 12 and the PMOS channel 22 can be illustratively made of silicon (Si). The first gate 30 can be illustratively made of silicon, a mixed crystal of silicon and germanium, or germanium. The optical waveguide 40 can be illustratively made of silicon oxide, silicon oxynitride, silicon nitride, or silicon.

The operation of this semiconductor device is described below.

An optical clock outputted from a light source, not shown, propagates in the optical waveguide 40 and is inputted to the first gate 30. If the first gate 30 is formed from a semiconductor with a bandgap narrower than the energy of this light, the first gate 30 absorbs the light and generates electrons e and holes h. As shown in FIG. 1, a voltage is applied across the first gate 30 for depletion under reverse bias. Then, among the electrons e and holes h generated by light absorption, the holes h pass above the channels of the CMOS 10 and flow into the low-level interconnect 50. Passage of holes h above the NMOS channel 12 and the PMOS channel 22 varies the output signal from the CMOS 10. The optical signal provided from the optical waveguide 40 to the first gate 30 is related to the voltage signal outputted from the output interconnect 70 of the CMOS 10 as shown in FIG. 1B. That is, this example enables inverter operation based on an optical signal.

Figure 2A:
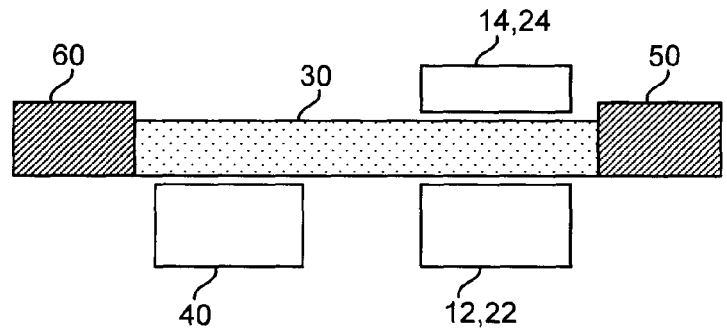
FIGS. 2A through 2C are conceptual diagrams showing how the channels of the CMOS 10 change.
Figure 2B:
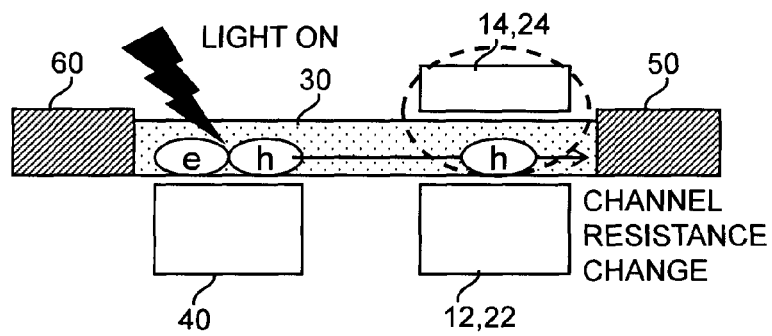
Figure 2C:
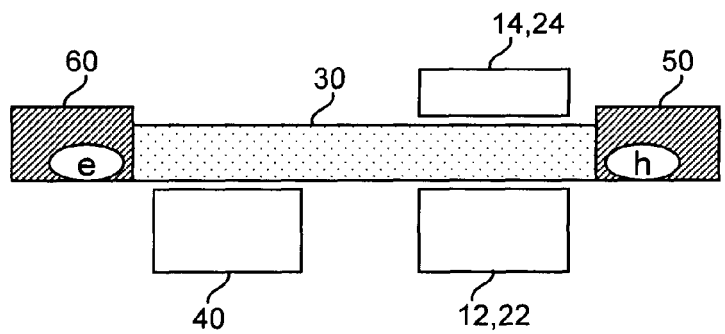

FIGS. 2A through 2C are conceptual diagrams showing how the channels of the CMOS 10 change when holes h travel in the first gate 30. In FIG. 2 and the following figures, elements similar to those described with reference to the previous figures are marked with like reference numerals and are not described in detail.

When the first gate 30 receives no optical signal, that is, when the optical signal is turned off (input 0), the first gate 30 is depleted and includes no extra charge as shown in FIG. 2A. Hence the input of the CMOS inverter is determined by the gate potential 0 (low level) given by the second gates 14, 24. Specifically, the PMOS channel 22 is turned on, the NMOS channel 12 is turned off, and hence the output signal outputted from the output interconnect 70 is "1".

On the other hand, when an optical signal is supplied, that is, when the optical signal is turned on (input 1), packets of electrons e and holes h are respectively generated in the first gate 30 directly above the optical waveguide 40 as shown in FIG. 2B. Following the direction of electric field, electrons e are absorbed by the high-level interconnect 60, and holes h travel toward the channels of the CMOS 10 and serve as an input signal. When the packet of holes h passes above the channels 12, 22 of the CMOS, the input of the CMOS inverter makes transition. More specifically, the potential of the first gate 30, which serves as gates above the NMOS channel 12 and the PMOS channel 22, apparently behaves as potential "1". Thus the PMOS channel 22 is turned off, and the NMOS channel 12 is turned on. Hence the signal outputted from the output interconnect 70 transitions to "0". That is, only at the moment that holes h pass above the channels of the CMOS 10, the output transitions to "0". The holes h that have passed above the channels of the CMOS 10 are absorbed by the low-level interconnect 50.

When the optical signal is turned off again, all the holes that have passed through the first gate 30 are absorbed by the low-level interconnect 50, and the first gate 30 is depleted again as shown in FIG. 2C. Hence the first gate 30 and the channels 12, 22 of the CMOS inverter are subjected to the gate potential applied from the second gates 14, 24, and the gate potential of the first gate 30 becomes 0 (low level). That is, the PMOS channel 22 is turned on, and the NMOS channel 12 is turned off. Hence the signal outputted from the output interconnect 70 returns to "1".

Here, the second gates 14, 24 shown in FIG. 1 serve to set the gate potential at the low level with respect to the NMOS channel 12 and the PMOS channel 22 when the optical signal is turned off (input 0), as shown in FIGS. 2A and 2C. Here, the potential provided to the second gates 14, 24 may be equal to that of the low-level interconnect 50 (e.g. 0 volts), or may be a potential on the low level side of the midpoint between the potentials of the low-level interconnect 50 and the high-level interconnect 60 (e.g., a potential lower than 0.5 volts when the low level is 0 volts and the high level is 1 volt).

When the potential applied to the second gates 14, 24 is too low, the effect of the potential on the channels of the CMOS 10 caused by holes h traveling through the first gate 30 may be suppressed. In this case, the potential applied to the second gates 14, 24 can be suitably adjusted so as to be placed slightly on the low level side of the midpoint between the potentials of the low-level interconnect 50 and the high-level interconnect 60. That is, the potential provided to the second gates 14, 24 can be suitably determined so that the potential does not obstruct the operation of the CMOS effected by holes h traveling through the first gate 30 and that the first gate 30 in the depleted state can be provided with a gate potential at an effectively low level with respect to the channels of the CMOS.

Figure 3:
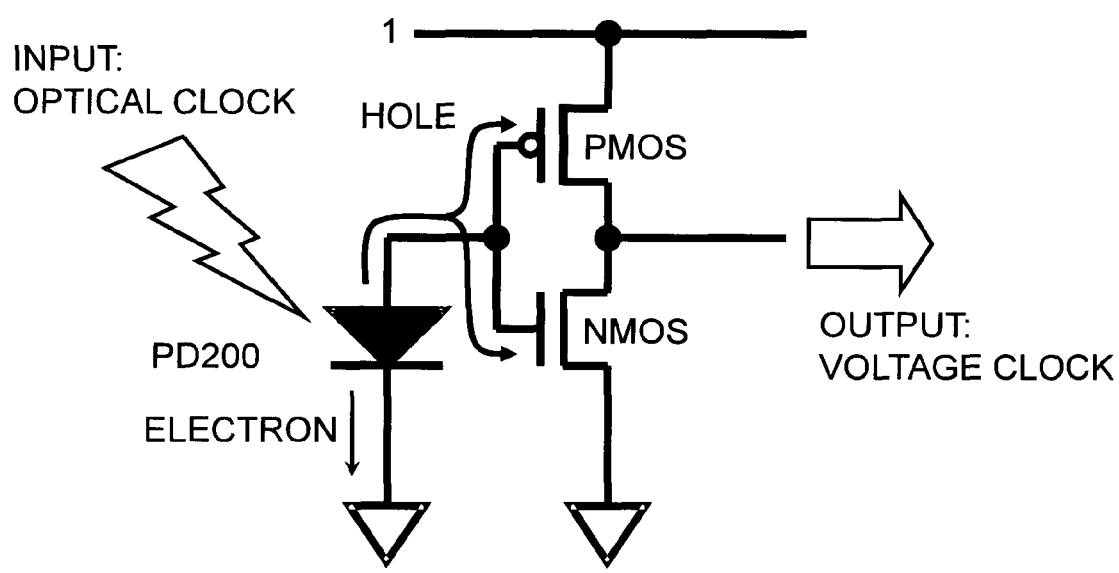
FIG. 3 is a schematic diagram showing the semiconductor device described in JP-A 6-209119(Kokai).

FIG. 3 is a schematic diagram showing the semiconductor device described in JP-A 6-209119(Kokai).

In this comparative example, the output voltage of a photodiode 200 is applied to the two gates of the CMOS. That is, light-voltage conversion is possible in principle if an optical signal can be provided to the photodiode 200 and converted to voltage for controlling the CMOS channels. However, the circuit of this comparative example lacks a mechanism for eliminating minute charge of one type (holes in this case)

accumulated in the PMOS and NMOS gate within a period of the optical clock, and hence is inoperable as an inverter. That is, it is difficult to turn off the CMOS.

In contrast, in the present embodiment, the first gate 30 is formed between the low-level interconnect 50 and the high-level interconnect 60, and holes h are passed above the channels of the CMOS 10. Thus the CMOS 10 can be reliably turned on and off. Furthermore, by providing the second gates 14, 24, the low level of the gate potential provided to the channels of the CMOS 10 can be defined more reliably.

Figures 4A, 4B:
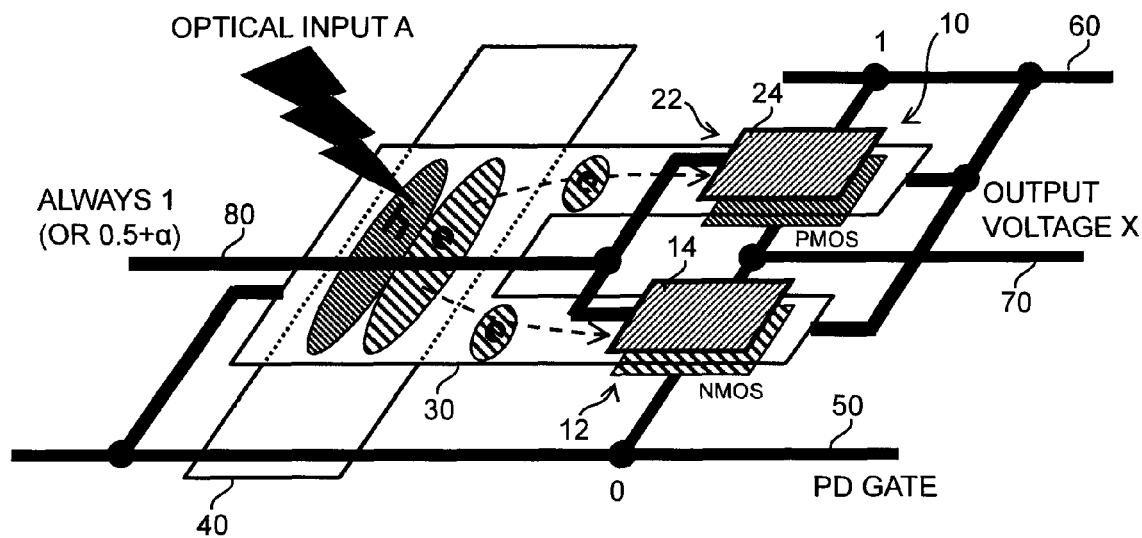
FIG. 4A is a conceptual diagram showing another example of the semiconductor device.
FIG. 4B is a state transition table showing the operation of the semiconductor device.

FIG. 4A is a conceptual diagram showing another example of the semiconductor device according to the first embodiment of the invention. FIG. 4B is a state transition table showing the operation of this semiconductor device.

This example is an electron transport-type semiconductor device. More specifically, the optical waveguide 40 side of the first gate 30 is connected to the low-level interconnect 50, and the CMOS 10 side thereof is connected to the high-level interconnect 60. Furthermore, also in this example, the first gate 30 has an optoelectric conversion function. That is, the first gate 30 absorbs light and generates electrons and holes. The second gates 14, 24 are provided with a high-level potential.

In this example, when an optical signal is supplied from the optical waveguide 40 to the first gate 30, where electrons e and holes h are generated, the holes h are absorbed by the low-level interconnect 50, and the electrons e pass above the channels of the CMOS 10 and are absorbed by the high-level interconnect 60. Thus, as shown in FIG. 4B, a homopolar output voltage is obtained in response to the inputted optical signal.

Figure 5A:
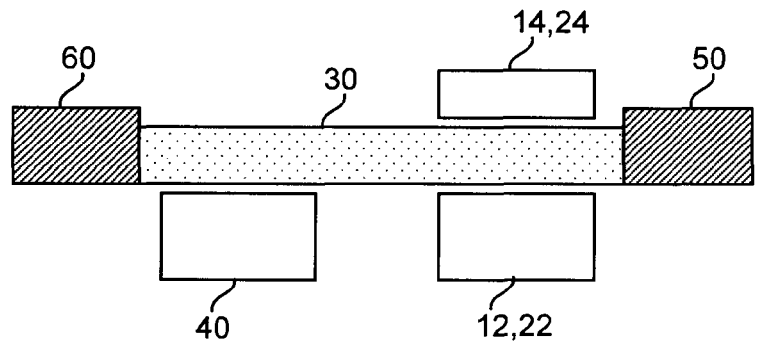
FIGS. 5A through 5C are conceptual diagrams showing how the channels of the CMOS 10 change.
Figure 5B:
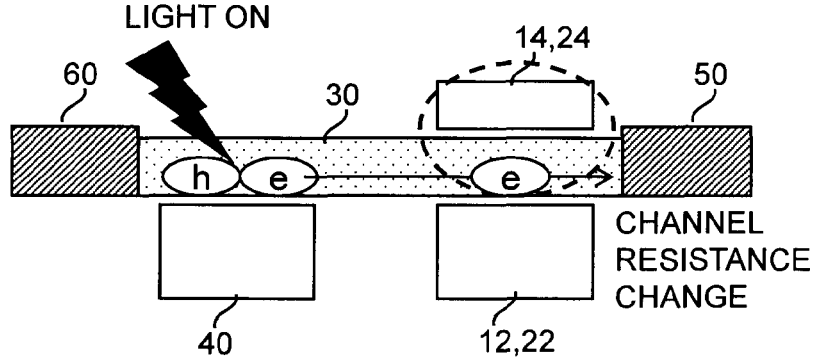
Figure 5C:
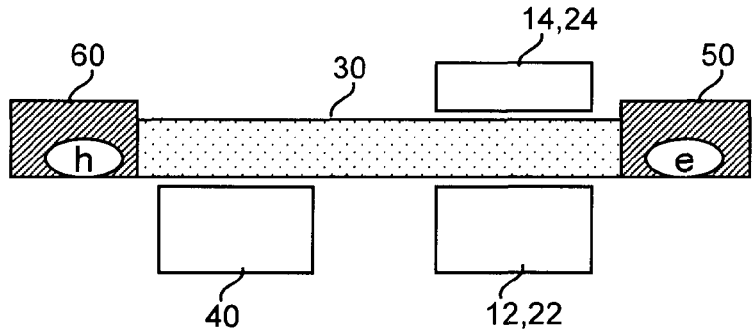

FIGS. 5A through 5C are conceptual diagrams showing how the channels of the CMOS 10 change when electrons e travel in the first gate 30.

When the first gate 30 receives no optical signal, that is, when the optical signal is turned off (input 0), the first gate 30 is depleted and includes no extra charge as shown in FIG. 5A. Hence the input of the CMOS inverter is determined by the gate potential 1 (high level) given by the second gates 14, 24. Specifically, the PMOS channel 22 is turned off, the NMOS channel 12 is turned on, and hence the output signal outputted from the output interconnect 70 is "0".

On the other hand, when an optical signal is supplied, that is, when the optical signal is turned on (input 1), packets of electrons e and holes h are respectively generated in the first gate 30 directly above the optical waveguide 40 as shown in FIG. 5B. Following the direction of electric field, holes h are absorbed by the low-level interconnect 50, and electrons e travel toward the channels of the CMOS 10 and serve as an input signal. When the packet of electrons e pass above the channels 12, 22 of the CMOS, the input of the CMOS inverter makes transition. More specifically, the potential of the first gate 30, which serves as gates above the NMOS channel 12 and the PMOS channel 22, apparently behaves as potential "0". Thus the PMOS channel 22 is turned on, and the NMOS channel 12 is turned off. Hence the signal outputted from the output interconnect 70 transitions to "1". That is, only at the moment that electrons e pass above the channels of the CMOS 10, the output transitions to "1". The electrons e that have passed above the channels of the CMOS 10 are absorbed by the high-level interconnect 60.

When the optical signal is turned off again, all the electrons e that have passed through the first gate 30 are absorbed by the high-level interconnect 60, and the first gate 30 is depleted again as shown in FIG. 5C. Hence the first gate 30 and the channels 12, 22 of the CMOS inverter are subjected to the gate potential applied from the second gates 14, 24, and the gate potential of the first gate 30 becomes 1 (high level). That is, the PMOS channel 22 is turned off, and the NMOS channel 12 is turned on. Hence the signal outputted from the output interconnect 70 returns to "0".

Also in this example, the second gates 14, 24 shown in FIG. 4 serve to set the gate potential at the high level with respect to the NMOS channel 12 and the PMOS channel 22 when the optical signal is turned off (input 0), as shown in FIGS. 5A and 5C. Here, the potential provided to the second gates 14, 24 may be equal to that of the high-level interconnect 60 (e.g. 1 volts), or may be a potential on the high level side of the midpoint between the potentials of the low-level interconnect 50 and the high-level interconnect 60 (e.g., a potential higher than 0.5 volts when the low level is 0 volts and the high level is 1 volt).

Also in this example, when the potential applied to the second gates 14, 24 is too high, the effect of the potential on the channels of the CMOS 10 caused by electrons e traveling through the first gate 30 may be suppressed. In this case, the potential applied to the second gates 14, 24 can be suitably adjusted so as to be placed slightly on the high level side of the midpoint between the potentials of the low-level interconnect 50 and the high-level interconnect 60. That is, the potential provided to the second gates 14, 24 can be suitably determined so that the potential does not obstruct the operation of the CMOS effected by electrons e traveling through the first gate 30 and that the first gate 30 in the depleted state can be provided with a gate potential at an effectively high level with respect to the channels of the CMOS.

Next, the operating speed of the semiconductor device of this embodiment is described.

Figure 6:
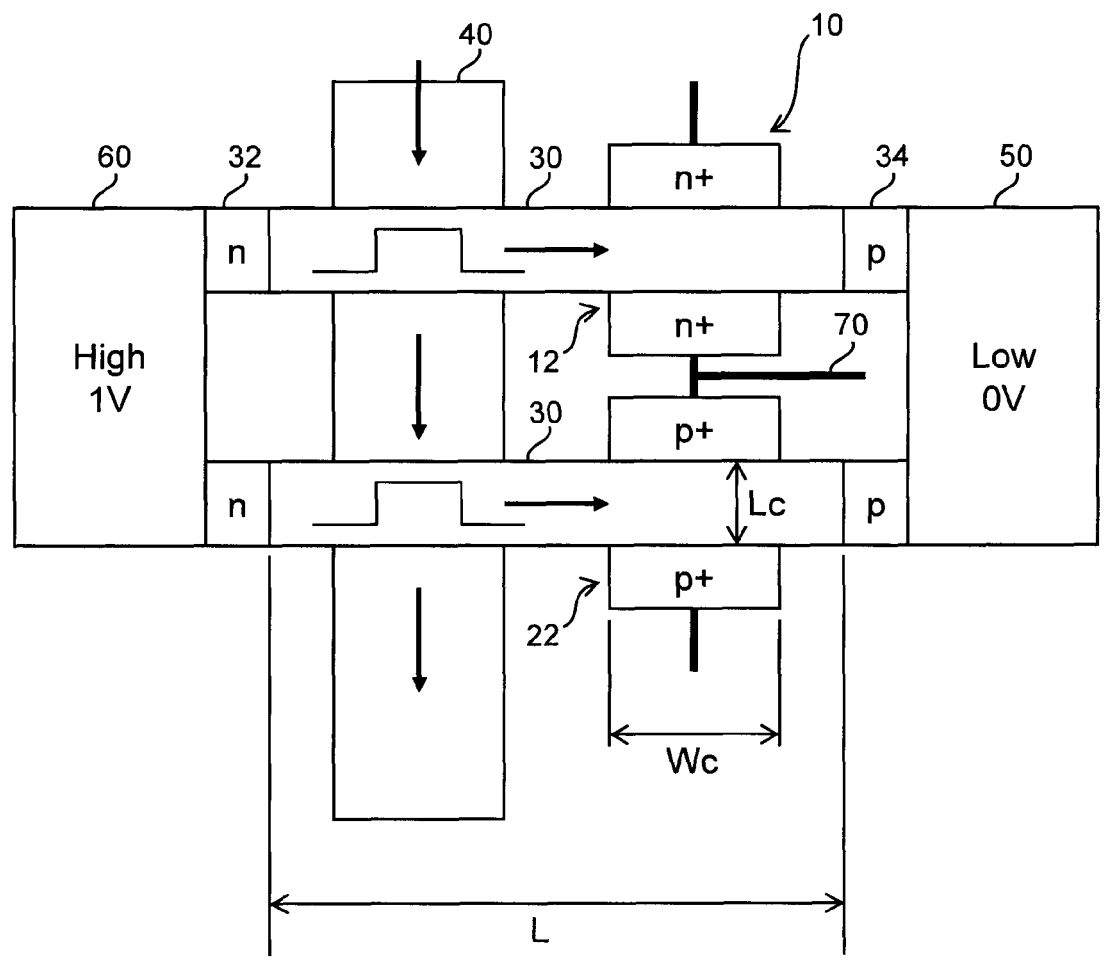
FIG. 6 is a schematic diagram showing a hole transport-type semiconductor device.

FIG. 6 is a schematic diagram showing a hole transport-type semiconductor device similar to that described above with reference to FIGS. 1 and 2.

In this example, the first gate 30 is provided in each of the NMOS channel 12 and the PMOS channel 22. The first gate 30 has an optoelectric conversion function, that is, it absorbs light and generates electrons and holes. For depleting the first gate 30, an n-type semiconductor region 32 is provided on the high-level side thereof, and a p-type semiconductor region 34 is provided on the low-level side thereof. The first gate 30 can be formed from i-type semiconductor, which is scarcely doped with impurities. Application of a bias between the n-type semiconductor region 32 and the p-type semiconductor region 34 results in a reverse-biased pn junction, and the first gate 30 is depleted.

Here, when an optical signal propagates in the optical waveguide 40, the light-receiving timings at the two first gates 30 are not simultaneous in a strict sense. However, this effect is assumed negligible.

A description is given of clocking characteristics with reference to the example shown in FIG. 6.

The first gate 30 is made of silicon (Si), and the size of each portion is defined as follows:

| | |
|---|---|
| Voltage V applied to the first gate 30 | 1 V |
| Length L of the first gate 30 | 500 nm |
| Hole mobility $\mu$ in the first gate 30 | 450 cm$^2$/Vs |
| Electric field strength E of the first gate 30 | 20,000 V/cm |
| Channel width $W_c$ | 50 nm |
| Channel length $L_c$ | 50 nm |
| Gate capacitance $C_g$ | $2 \times 10^{-17}$ F |
| CMOS power supply voltage $V_{dd}$ | 1 V |

Here, the hole mobility $\mu$ in the first gate 30 is the value for low doped silicon.

The number of charges (holes) required for channel control of the CMOS 10 is determined to be 135 by the following formula. Here, this is the number of charges required for one clock period.

Number of charges required for channel control, $N = C_g \times V_{dd} / q = 135$ From hole velocity, the time for a hole to pass through the channel and the transit time for a hole to travel through the first gate 30 can be determined. Assuming that the first gate 30 is made of silicon, the former is 1 picosecond (ps), and the transit time is 6 picoseconds (ps), approximately. Here, the optical pulse width of the optical clock is assumed to be 5 ps.

| | |
|---|---|
| Hole velocity $v = \mu \times E$ | 90,000 m/s |
| Channel passage time $t = W_c/v$ | 1.1 ps |
| Hole transit time $T = L/v$ | 5.6 ps |
| Optical pulse width $\tau$ | 5.0 ps |

Thus the current flowing through the first gate 30 and the attainable maximum clock frequency can be approximately determined. The maximum clock frequency is assumed to be half the response frequency, which is determined by the inverse of the total time of the optical pulse width and the transit time. It turns out as a result of calculation that the maximum clock frequency is approximately 50 GHz, which still provides a good margin beyond 10 GHz.

When the optical pulse width is long, current continues to flow even after the channel is turned on/off. This implies flow of excess current that does not contribute to channel control. Channel light-receiving sensitivity is defined as a value of the channel passage time divided by the optical pulse width. As the optical pulse width becomes closer to the channel passage time, the channel light-receiving sensitivity approaches 1. This implies that the time to pass excess hole current is reduced and that efficient channel control can be achieved.

| | |
|---|---|
| Current $I \approx 2$ routes $\times q \times N \times$ clock frequency 10 GHz | 0.4 µA |
| Maximum clock frequency $F_{max} \approx 0.5/(T + \tau)$ | 47 GHz |
| Channel light-receiving sensitivity $S \approx t/\tau$ | 0.11 |

In the following, another example of this embodiment is described.

Figure 7:
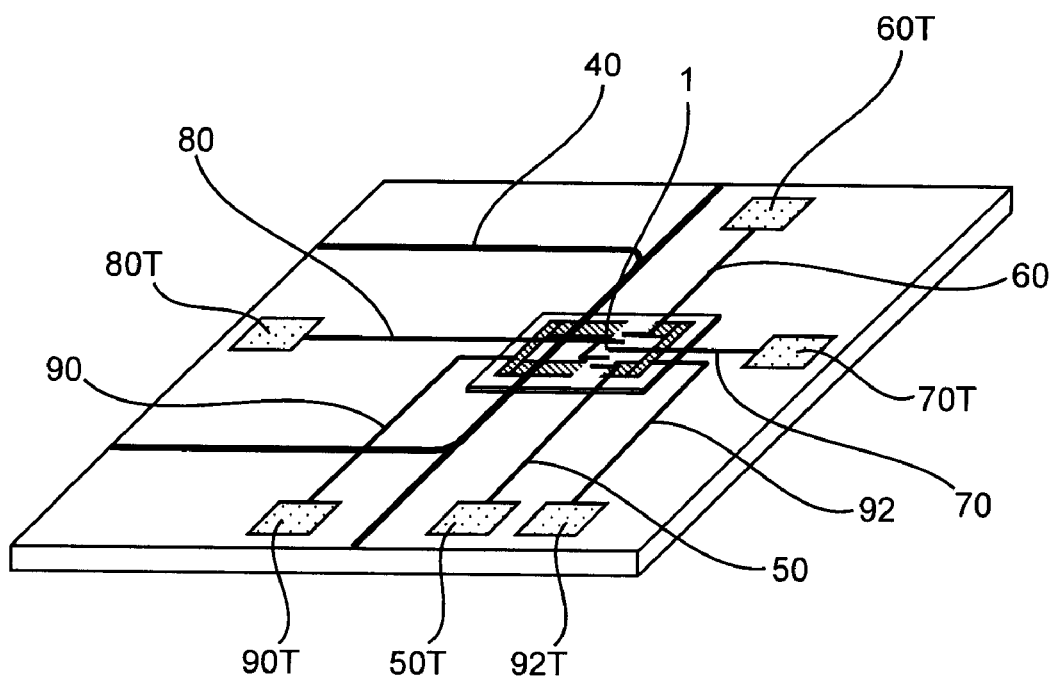
FIG. 7 is a schematic view illustrating the layout of the semiconductor device of this embodiment.

FIG. 7 is a schematic view illustrating the layout of the semiconductor device of this embodiment.

A hole transport-type light-voltage conversion element 1 illustrated in FIG. 1 is formed in the vicinity of the center of the chip. The CMOS 10 and the first gate 30 provided in the light-voltage conversion element 1 are made of silicon. From the light-voltage conversion element 1 to its periphery, an optical waveguide 40, a low-level interconnect 50, a high-level interconnect 60, an output interconnect 70, a gate interconnect 80, an interconnect 90 connected to the high-level side of the first gate 30, and an interconnect 92 connected to the low-level side of the first gate 30 are formed. These interconnects are connected to terminals 40T, 50T, 60T, 70T, 80T, 90T, and 92T formed near the peripheral edge of the chip, respectively.

The optical waveguide 40 can be illustratively made of silicon oxide.

The design values of this semiconductor device are as follows: high-level applied voltage of the first gate 30, V=3 V; length of the first gate 30, L=1 µm; hole mobility in the first gate 30, µ=400 cm²/Vs; channel width $W_C$=100 nm; and channel length $L_C$=50 nm (see FIG. 6). The optical clock inputted to the optical waveguide 40 is based on a CW semiconductor laser with a wavelength of 850 nm, modulated to 10 GHz by an external modulator. The optical pulse width is 5 ps.

Figure 8:
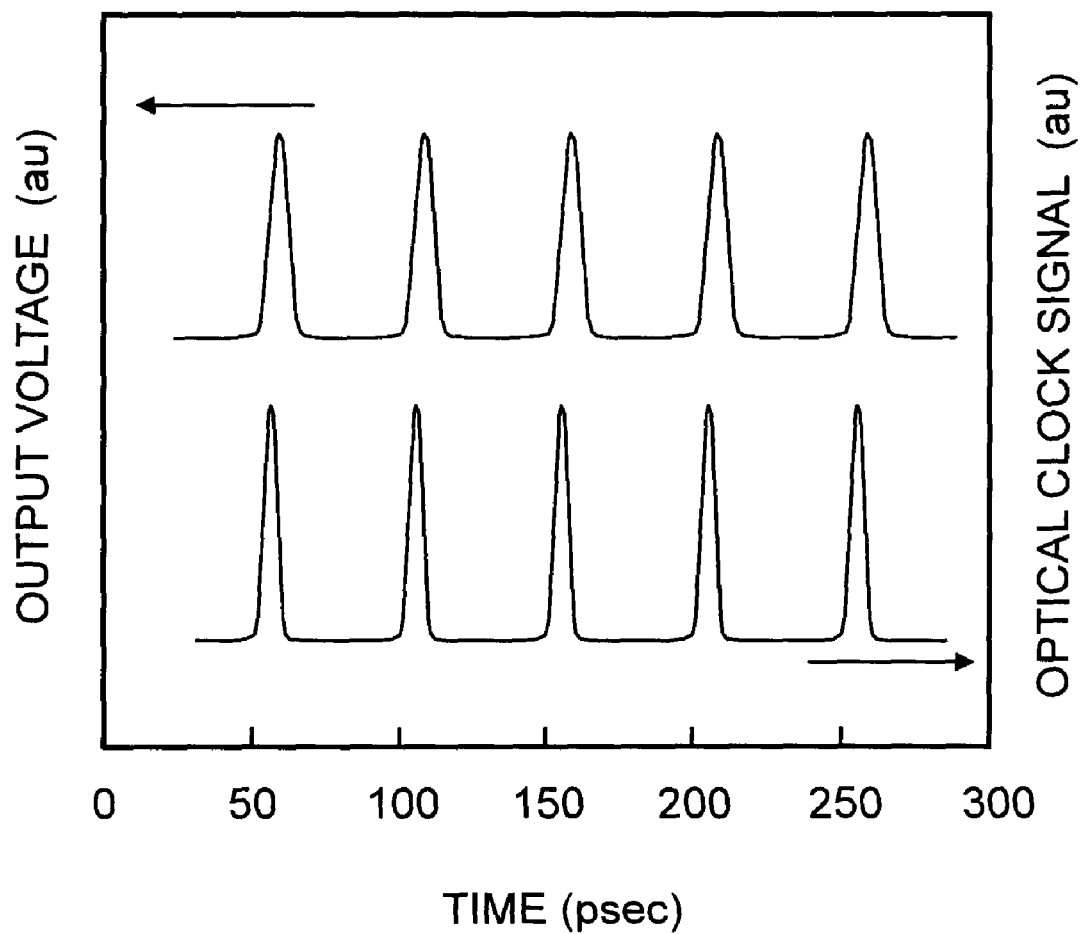
FIG. 8 is a graph showing the response characteristics of the output voltage from the CMOS inverter.

FIG. 8 is a graph showing the response characteristics of the output voltage from the CMOS inverter for an input of 10-GHz optical clock signal to the light-voltage conversion element 1 of this example. It turns out that, in response to the input light, an output voltage having the same period is obtained.

Here, the theoretical limit of laser light intensity Po required for circuit operation expected from calculation is 0.4 µW, and the theoretical limit of power consumption Pe of hole current flowing through the circuit is 1.2 µW. In this example, circuit operation was confirmed when the laser light intensity exceeded 1 µW.

Thus, according to this embodiment, voltage conversion with high speed and low power consumption can be achieved for optical clocking at 10 GHz.

Next, a description is given of the characteristics of the electron transport-type semiconductor device described above with reference to FIG. 4.

The size and material of each portion of the semiconductor device are the same as those described above with reference to FIG. 7. The electron mobility in the first gate 30 is µ=1000 cm²/Vs. The optical clock inputted to the optical waveguide 40 is based on a CW semiconductor laser with a wavelength of 850 nm, modulated to 10 GHz by an external modulator. The optical pulse width is 5 ps.

Figure 9:
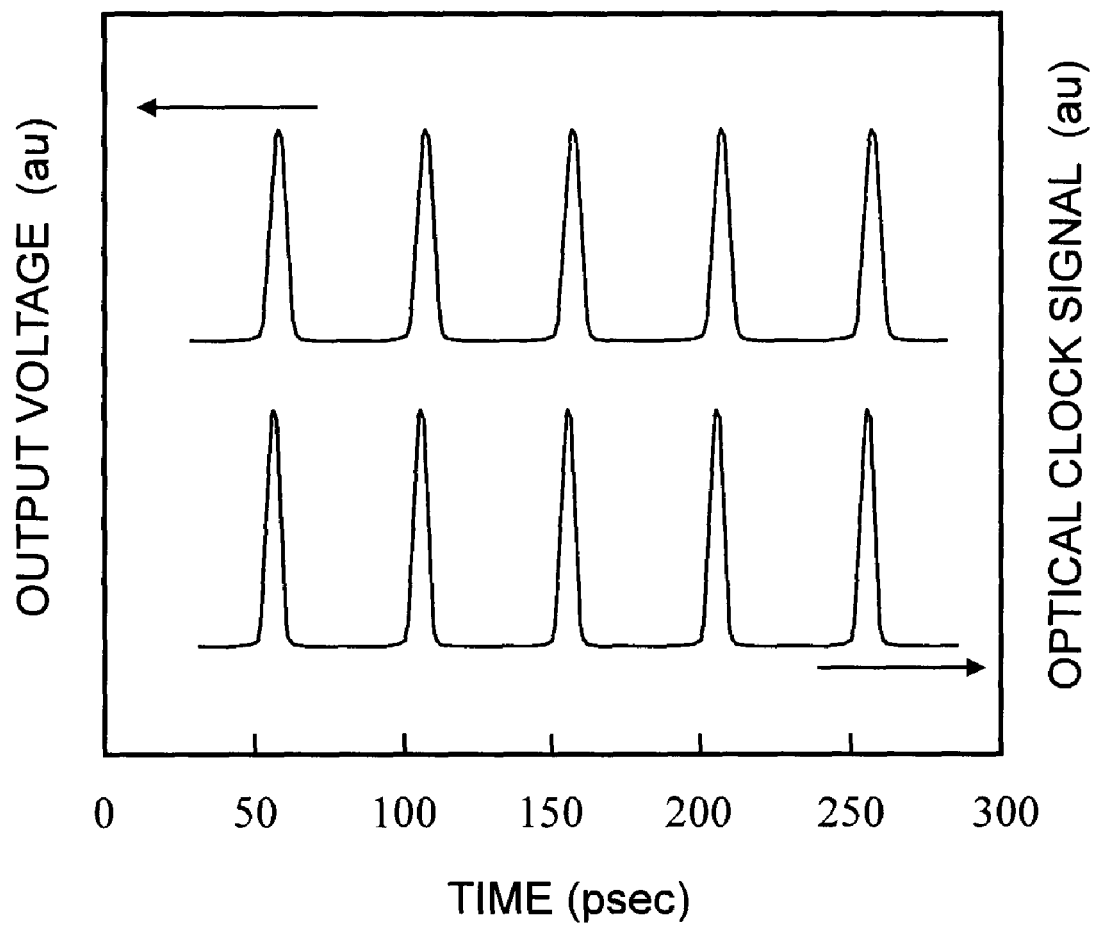
FIG. 9 is a graph showing the response characteristics of the output voltage from the CMOS inverter.

FIG. 9 is a graph showing the response characteristics of the output voltage from the CMOS inverter for an input of 10-GHz optical clock signal to the electron transport-type semiconductor device. It turns out also in this example that, in response to the input light, an output voltage having the same period is obtained.

In the case of the electron transport-type semiconductor device, the theoretical limit of laser light intensity Po required for circuit operation expected from calculation is 0.4 µW, and the theoretical limit of power consumption Pe of electron current flowing through the circuit is 1.2 µW. In this example, circuit operation was confirmed when the laser light intensity exceeded 1.4 µW.

Thus, also for the electron transport-type semiconductor device, it turns out that voltage conversion with high speed and low power consumption can be achieved for optical clocking at 10 GHz.

Next, a method for manufacturing a semiconductor device of this embodiment is described.

FIGS. 10A to 12D are process cross-sectional views illustrating the method for manufacturing a semiconductor device of this embodiment. In FIGS. 10A to 12D, the cross-sectional structure of the optical waveguide 40 portion is shown on the left side, and the cross-sectional structure of the CMOS 10 portion is shown on the right side.

Figure 10A:
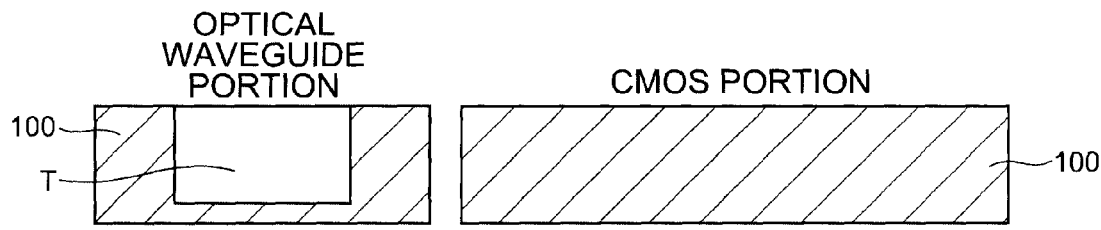
FIGS. 10A to 12D are process cross-sectional views illustrating the method for manufacturing a semiconductor device.

First, as shown in FIG. 10A, a trench T is formed in a region of a p-type silicon wafer 100 where an optical waveguide 40 is to be formed.

Figure 10B:
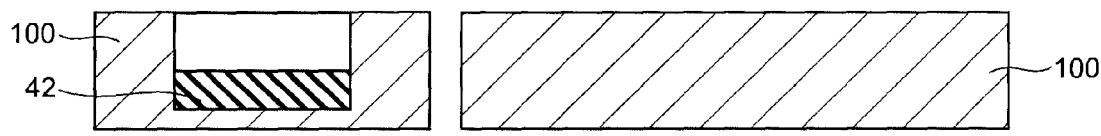

Then, as shown in FIG. 10B, a cladding layer 42 of the optical waveguide 40 is partially formed. For confining light in the optical waveguide 40, the cladding layer 42 is preferably formed from material having a lower refractive index than the optical waveguide 40. To this end, the cladding layer 42 can be illustratively formed from silicon oxide doped with boron (B).

Figure 10C:

Next, as shown in FIG. 10C, the optical waveguide 40 is formed. The optical waveguide 40 can be illustratively formed from silicon oxide doped with germanium (Ge) or phosphorus (P) for increasing the refractive index thereof.

Figure 10D:
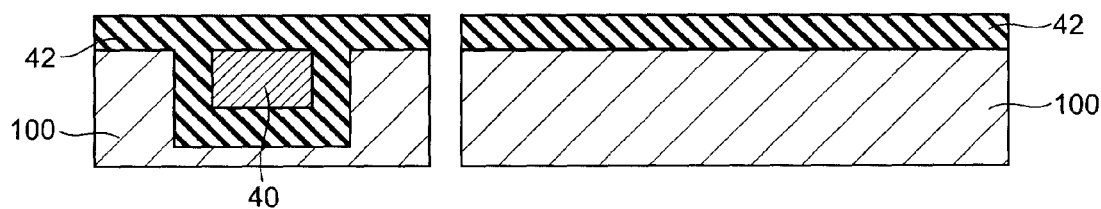

Next, as shown in FIG. 10D, a cladding layer 42 surrounding the optical waveguide 40 is formed.

Figure 10E:
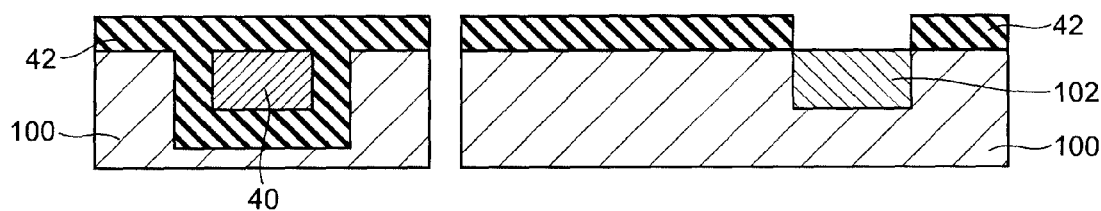
Figure 11A:
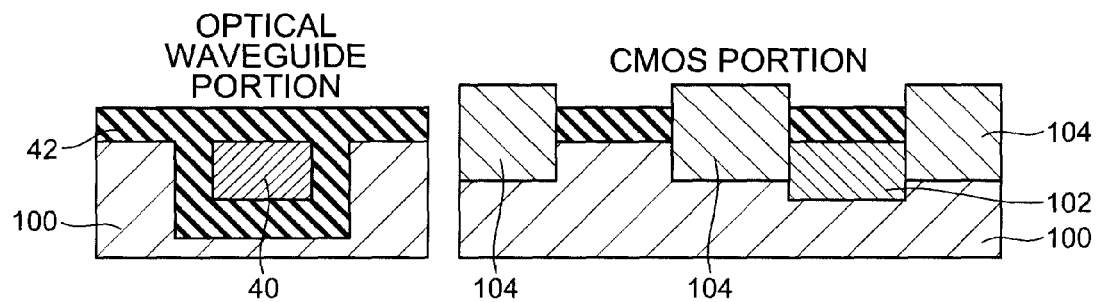

Then, as shown in FIG. 10E, an n-type well region 102 is formed in a portion where a PMOS channel 22 of the CMOS 10 is to be formed. Subsequently, as shown in FIG. 11A, an interelement isolation layer 104 is formed.

Figure 11B:
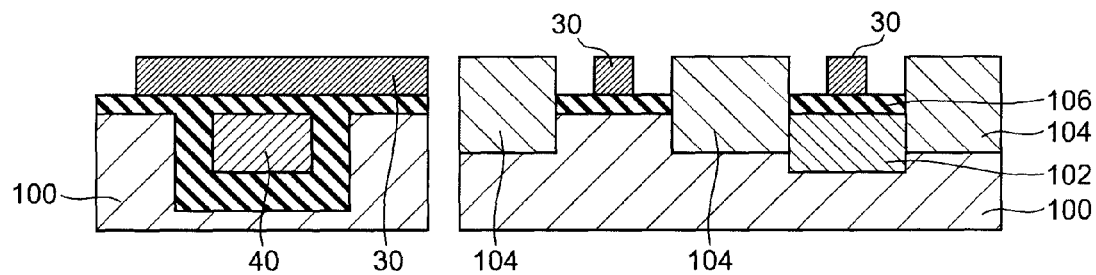

Next, as shown in FIG. 11B, an insulating film 106 to serve as a gate insulating film of the CMOS 10 is formed, and a first gate 30 is formed thereon. As described above, the first gate 30 can be formed from silicon, a mixed crystal of silicon and germanium, or germanium. The hole and electron travel velocity can be increased by forming the first gate 30 from single crystal. However, the first gate 30 may be polycrystalline or amorphous as long as the target operating speed is achieved. The thickness of the insulating film 106 between the optical waveguide 40 and the first gate 30 may be suitably adjusted for distributed coupling therebetween.

Figure 11C:
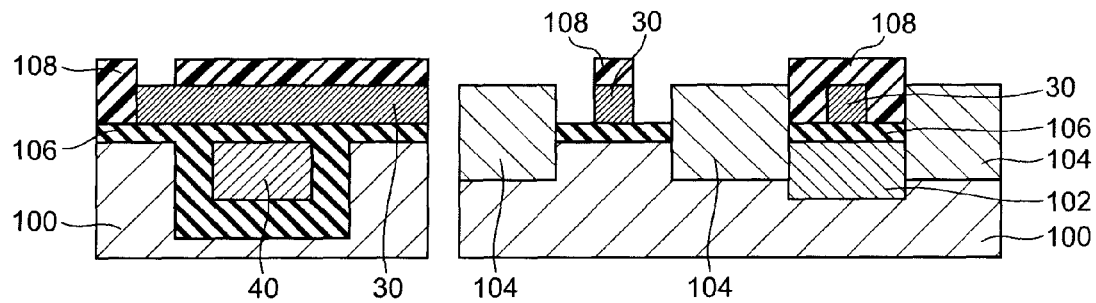
Figure 11D:
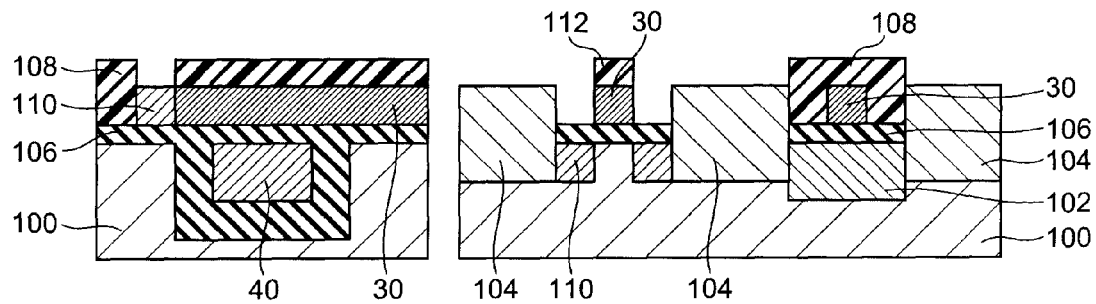

Next, as shown in FIG. 11C, a mask 108 is formed, and n-type impurities are introduced. Thus, as shown in FIG. 11D, the source/drain region 110 of the NMOS channel 12 is formed. Simultaneously, an n-type semiconductor region 32 (see FIG. 6) connected to the first gate 30 is formed.

Figure 12A:
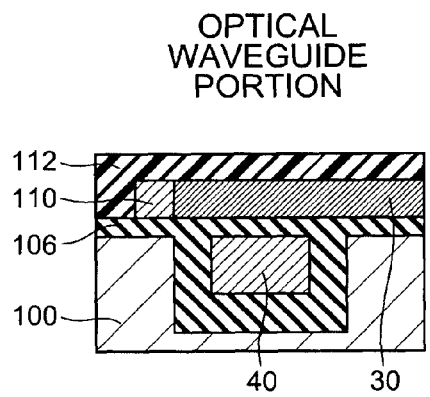
Figure 12A:
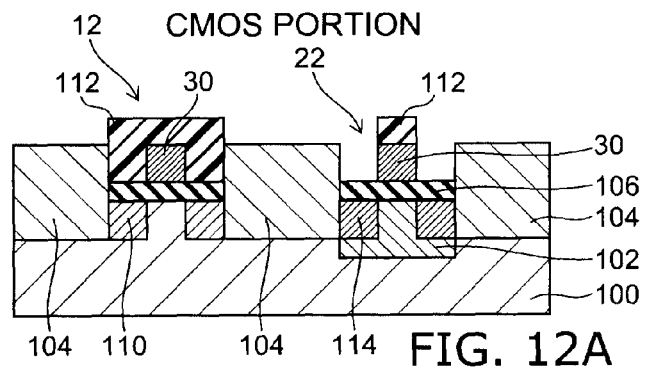

Next, as shown in FIG. 12A, a mask 112 is newly formed, and p-type impurities are introduced to form the source/drain region 114 of the PMOS channel 22. At this time, a p-type semiconductor region 34 (see FIG. 6) connected to the first gate 30 is simultaneously formed.

Figure 12B:
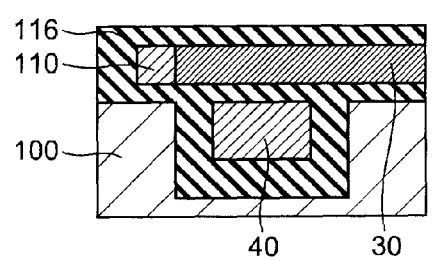
Figure 12B:
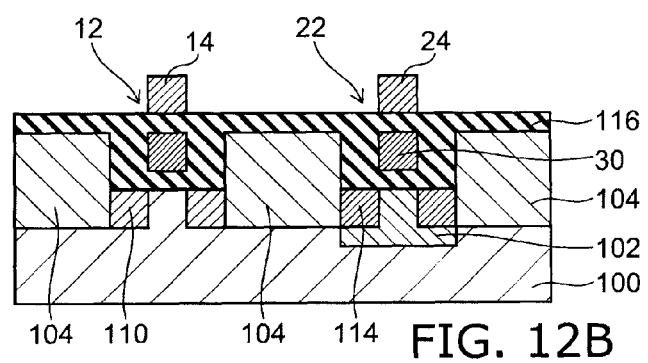

Subsequently, as shown in FIG. 12B, an insulating layer 116 is formed to bury the first gate 30, and second gates 14, 24 are formed above the NMOS channel 12 and the PMOS channel 22.

Figure 12C:
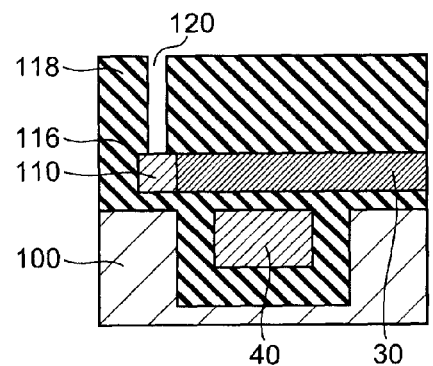
Figure 12C:
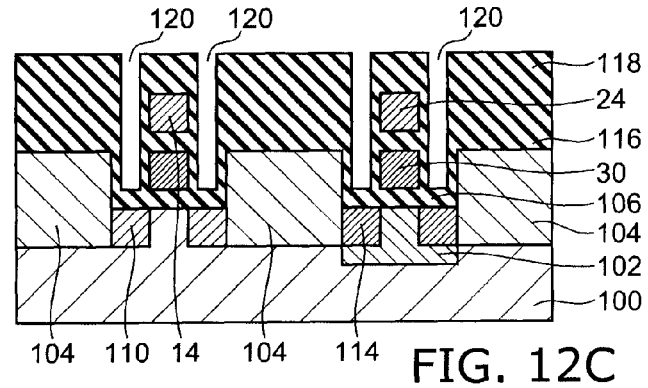

Then, as shown in FIG. 12C, an interlayer insulating layer 118 is formed, and contact holes 120 are opened.

Figure 12D:
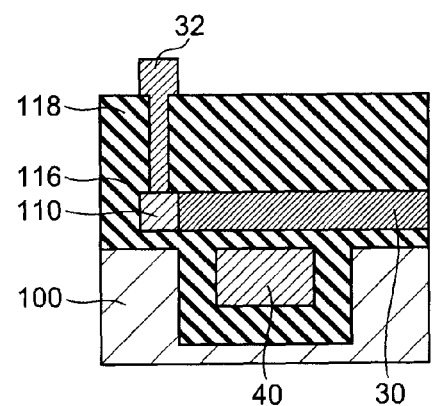
Figure 12D:
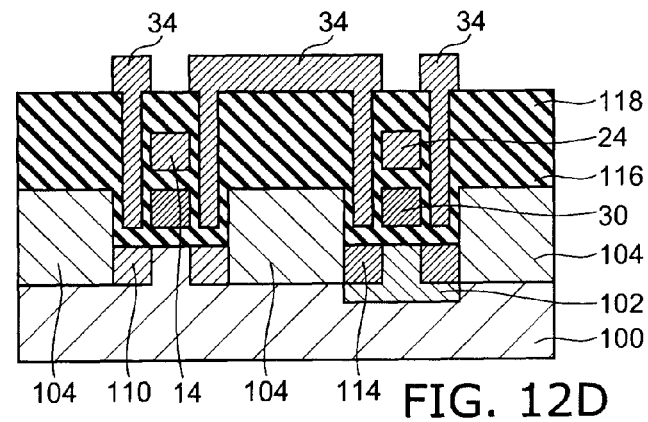

Subsequently, as shown in FIG. 12D, interconnects are connected through the contact holes 120 to the NMOS channel 12 and the PMOS channel 22, and to the n-type semiconductor region 32 and the p-type semiconductor region 34 (see FIG. 6) connected to the first gate 30.

Thus the main part of the semiconductor device of this embodiment is completed.

Next, a second embodiment of the invention is described.

Figure 13:
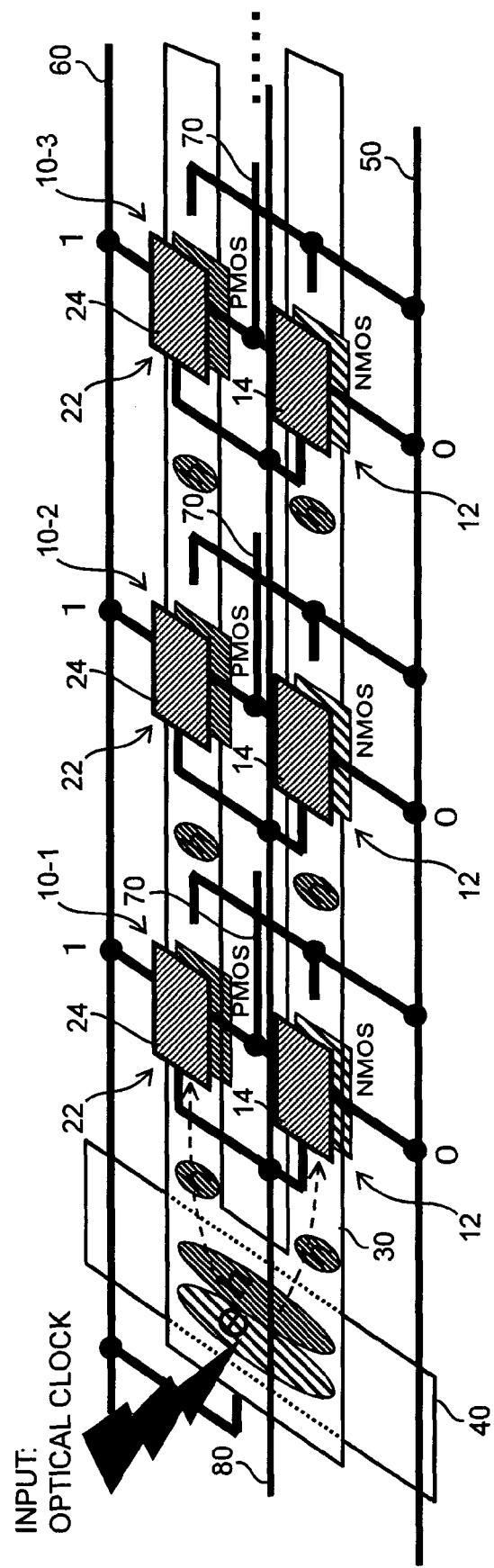
FIGS. 13 and 14 are conceptual diagrams showing a semiconductor device.
Figure 14:
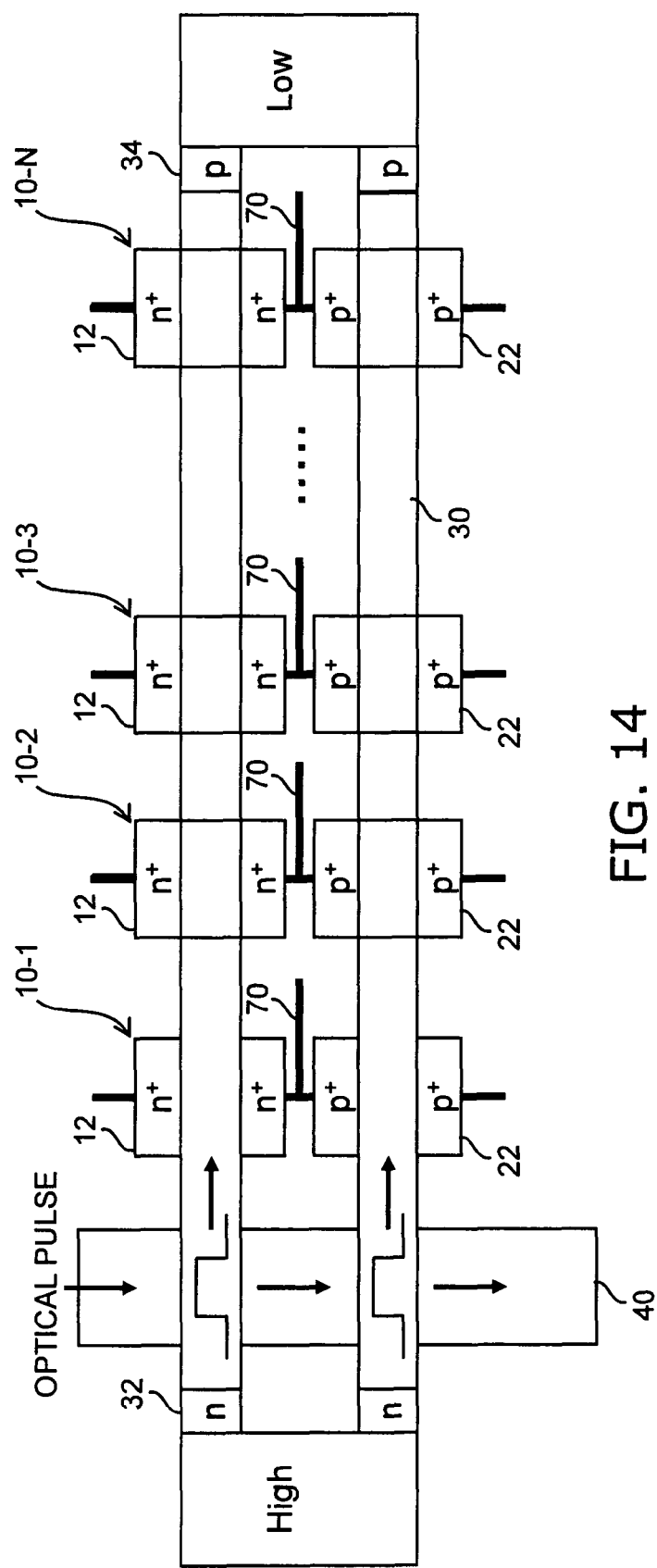

FIGS. 13 and 14 are conceptual diagrams showing a semiconductor device according to the second embodiment of the invention.

The semiconductor device of this embodiment comprises CMOS 10-1, 10-2, 10-3, . . . as a plurality of transistor pairs. These transistor pairs, or CMOS, can be controlled by a common first gate 30. That is, the first gate 30 extends above the NMOS channels 12 and the PMOS channels 22 of these CMOS. Also in this example, the first gate 30 has an optoelectric conversion function, that is, it absorbs light and generates electrons and holes.

In response to input of an optical pulse from an optical waveguide 40 to the first gate 30, electrons and holes are generated in the first gate 30. In this example, as described above with reference to FIGS. 1 and 2, the generated holes travel in the first gate 30 toward the low level. At this time, CMOS 10-1, 10-2, 10-3, . . . are operated. Here, "0" is outputted from the output interconnect 70 of each CMOS. The second gates 14, 24 of the CMOS 10-1, 10-2, 10-3, . . . are commonly connected to a gate interconnect 80 and provided with a low-level potential. Hence, when no optical pulse is supplied to the optical waveguide 40, "1" is outputted from the output interconnect 70 of each CMOS as described above with reference to FIGS. 1 and 2.

Thus an inverter output in response to the optical pulse is obtained from the output interconnect 70 of each CMOS. It is possible to synchronize a plurality of circuits by supplying the voltage clock signals obtained from these output interconnects 70 to the plurality of circuits.

Figure 15:
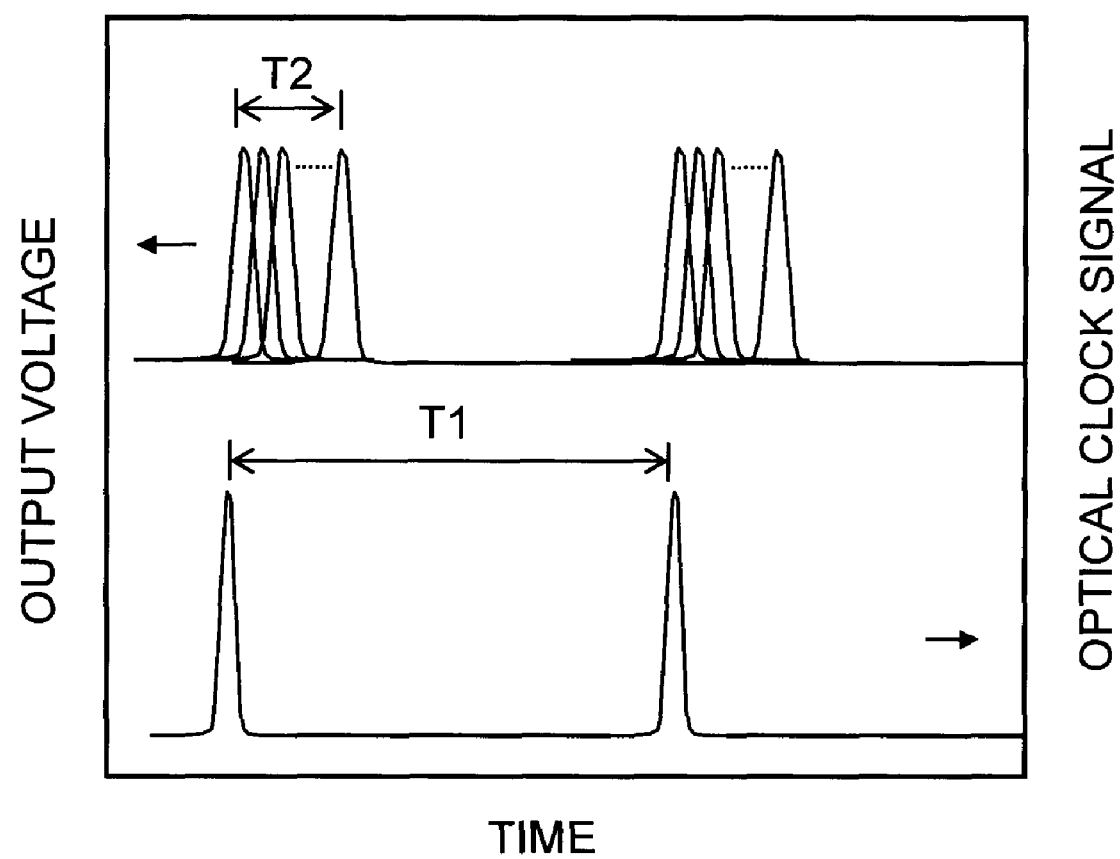
FIG. 15 is a schematic diagram showing the relationship between the optical clock signal and the output voltage.

FIG. 15 is a schematic diagram showing the relationship between the optical clock signal and the output voltage in this embodiment. When an optical clock signal having a period of T1 is supplied to the optical waveguide 40, voltage outputs in response to the optical pulse are successively outputted from the output interconnects 70 of the CMOS 10-1, 10-2, 10-3, . . . . In FIG. 15, the output voltage shown is inverted.

As can be seen from FIGS. 13 and 14, upon receipt of an optical pulse from the optical waveguide 40, holes are generated in the first gate 30 and successively pass through the channels of the CMOS 10-1, 10-2, 10-3 . . . In response, as shown in FIG. 15, voltage pulses are successively outputted from these CMOS. When the first gate 30 is made of silicon, the time for a hole to travel 1 μm is approximately 10 picoseconds. On the other hand, the period T1 of the 10-GHz clock is 100 picoseconds. Hence, by reducing the spacing between the CMOS 10-1, 10-2, 10-3, . . . , the delay width T2 of voltage pulses outputted from these CMOS can be decreased to ¹⁄₁₀ or less of the clock period T1. That is, a plurality of circuits can be virtually synchronized by causing a plurality of CMOS to successively operate with a small delay for outputting voltage pulses.

Next, power consumption of the semiconductor device of this embodiment is described.

Here, comparison is made among a conventional CMOS based on current clocking, a light-current conversion CMOS, and the CMOS of this embodiment.

When one CMOS is operated by current clocking, the current consumption I1 and power consumption W1 are expressed by the following formulas:

$$I1 = 2 \times C_g \times V_{dd} \times f$$

$$W1 = 2 \times C_g \times V_{dd}^2 \times f$$

where $C_g$ is the gate capacitance of the CMOS, $V_{dd}$ is the operating voltage, and f is the clock frequency. Multiplication of these factors yields a charge/discharge current for one transistor, or current consumption. It is doubled because a CMOS has two transistors.

Figure 16:
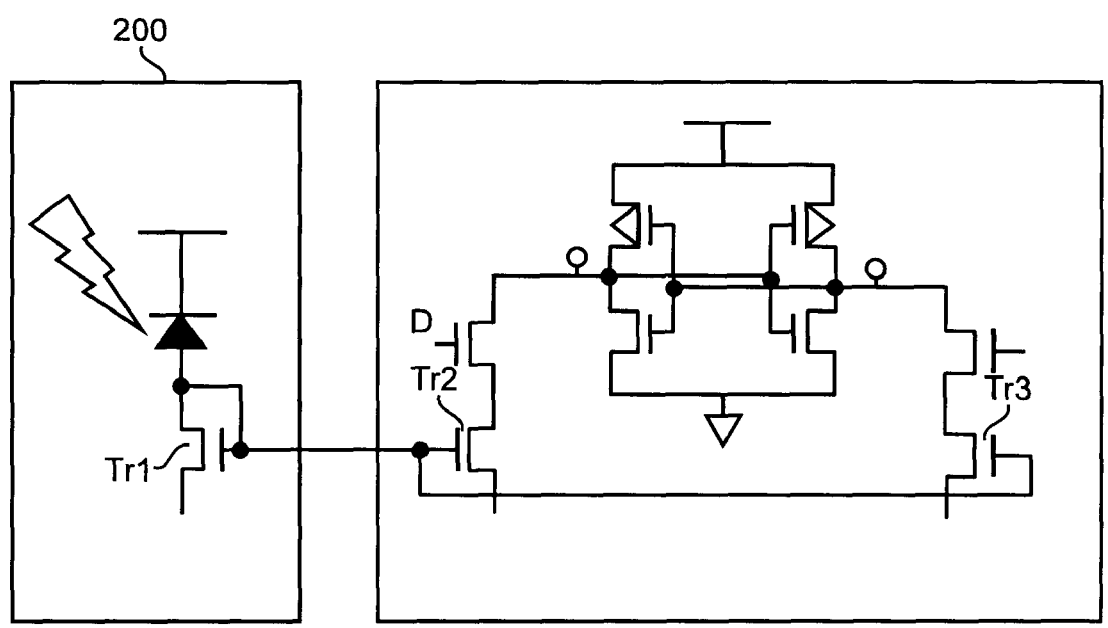
FIG. 16 is a schematic diagram showing a light-current conversion semiconductor device as a comparative example.

FIG. 16 is a schematic diagram showing a light-current conversion semiconductor device as a comparative example.

In this comparative example, an optical pulse signal is received by a photodiode 200. In response, a current pulse is provided to transistors Tr2, Tr3 for latch operation. In this comparative example, three transistors Tr1, Tr2, and Tr3 are operated in response to an optical pulse. Hence the current consumption I2 and power consumption W2 are given by the following formulas:

$$I2 = 3 \times C_g \times V_{dd} \times f$$

$$W2 = 3 \times C_g \times V_{dd}^2 \times f$$

Furthermore, this comparative example also needs energy for generating optical pulses. Assuming that the quantum efficiency is 100 percent, the energy for generating an optical pulse equals the energy consumed in its conversion to current.

Hence the current consumption I3 and power consumption W3 required for generating an optical pulse are given by the following formulas:

$$I3=3\times C_g \times V_{dd} \times f$$

$$W3=3\times C_g \times V_{dd}^2 \times f$$

If the quantum efficiency is lower than 100 percent, the current consumption I3 and power consumption W3 are larger.

Therefore, in this comparative example, the total current consumption I4 and power consumption W4 are given by the following formulas:

$$I4=I2+I3=6\times C_g \times V_{dd} \times f$$

$$W4=W2+W3=6\times C_g \times V_{dd}^2 \times f$$

On the other hand, in the semiconductor device of the present embodiment including N CMOS, the current consumption I5 and power consumption W5 required for operating one CMOS are given by the following formulas, assuming that the high-level applied voltage V of the first gate 30 equals $V_{dd}$:

$$I5=2\times C_g \times V_{dd} \times f/N$$

$$W5=2\times C_g \times V_{dd}^2 \times f/N$$

This embodiment likewise needs energy for generating optical pulses as well. Assuming that the quantum efficiency is 100 percent, the energy for generating an optical pulse equals the energy consumed in its conversion to current. Hence, assuming that N CMOS are provided, the current consumption I6 and power consumption W6 for an optical pulse required for operating one CMOS are given by the following formulas:

$$I6=2\times C_g \times V_{dd} \times f/N$$

$$W6=2\times C_g \times V_{dd}^2 \times f/N$$

Therefore, in this embodiment, the total current consumption I7 and power consumption W7 are given by the following formulas:

$$I7=I5+I6=4\times C_g \times V_{dd} \times f/N$$

$$W7=W5+W6=4\times C_g \times V_{dd}^2 \times f/N$$

Summarizing these results, the current consumption and power consumption required per CMOS are as follows:

|  | Current consumption | Power consumption |
| --- | --- | --- |
| Current-driven CMOS | $2 \times C_g \times V_{dd} \times f$ | $2 \times C_g \times V_{dd}^2 \times f$ |
| Light-current conversion CMOS | $6 \times C_g \times V_{dd} \times f$ | $6 \times C_g \times V_{dd}^2 \times f$ |
| Present embodiment | $4 \times C_g \times V_{dd} \times f/N$ | $4 \times C_g \times V_{dd}^2 \times f/N$ |

In this embodiment, when the number of CMOS, N, is larger than 2, the power consumption can be decreased relative to the conventional current-driven CMOS. In the case of 100 percent quantum efficiency, the power consumption per CMOS is half that of the conventional current-driven CMOS for the number of CMOS, N, equal to 4, ¼ for N equal to 8, and 1/10 for N equal to 20.

This embodiment thus enables a plurality of CMOS to be efficiently driven because the optical signal is converted to voltage, that is, because the CMOS is operated by simply causing holes generated by the optical pulse to travel without consumption.

As described above, in this embodiment, a plurality of CMOS are driven with high efficiency and operated at high speed by optical pulses, and the power consumption can be reduced as well.

Figure 17:
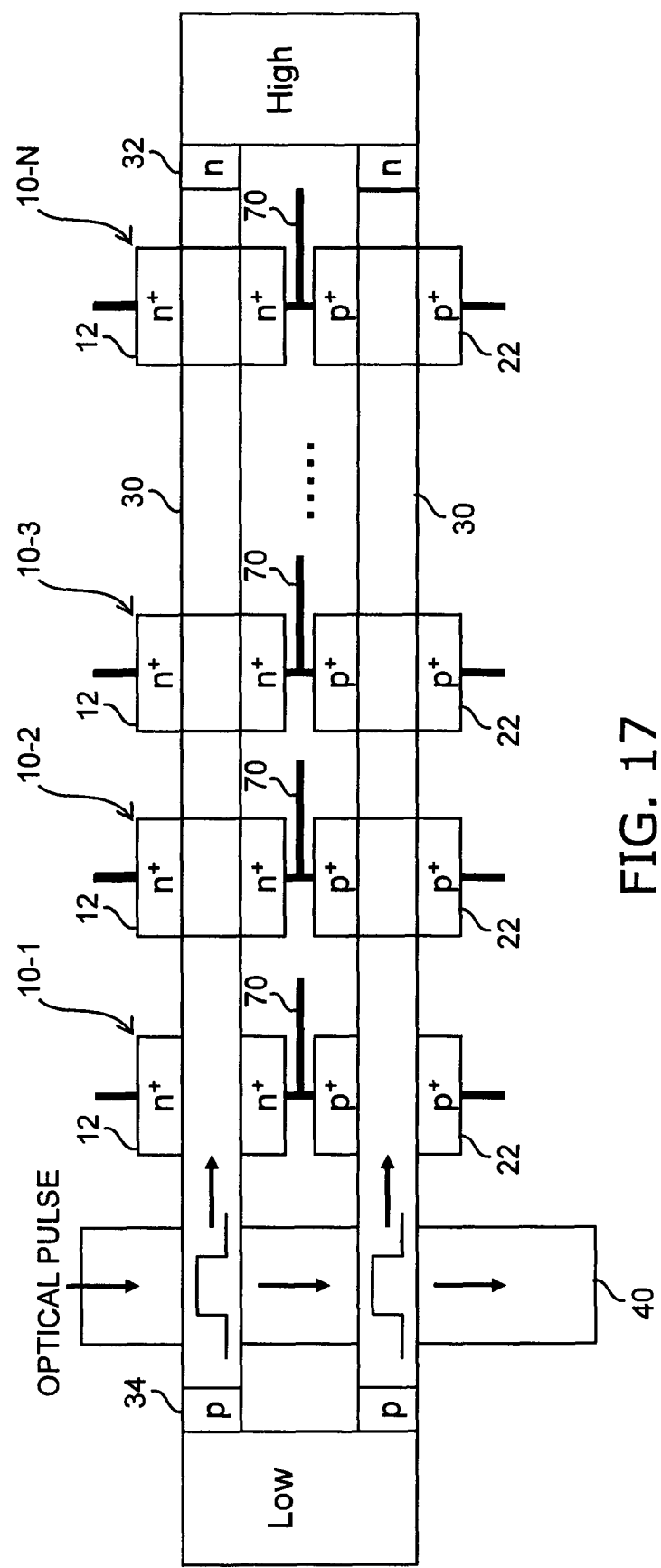
FIG. 17 is a conceptual diagram showing an electron transport-type semiconductor device.

FIG. 17 is a conceptual diagram showing an electron transport-type semiconductor device.

Also in this example, a common first gate 30 extends above the channels of a plurality of CMOS 10-1, 10-2, 10-3, . . . As described above with reference to FIGS. 4 and 5, when an optical pulse is supplied to the optical waveguide 40, electrons and holes are generated in the first gate 30, and the electrons pass through above the channels of the CMOS 10-1, 10-2, 10-3, . . . toward the high level. At this time, "1" is successively outputted from the output interconnect 70 of each CMOS.

As described above with reference to FIGS. 4 and 5, the CMOS 10-1, 10-2, 10-3, . . . are provided with second gates 14, 24, which are provided with a high-level potential. Hence, when no optical pulse is supplied to the optical waveguide 40, "0" is outputted from the output interconnect 70 of each CMOS as described above with reference to FIGS. 4 and 5.

Thus a voltage pulse in response to the optical pulse is obtained from the output interconnect 70 of each CMOS. It is possible to synchronize a plurality of circuits by supplying the voltage clock signals obtained from these output interconnects 70 to the plurality of circuits.

Figure 18:
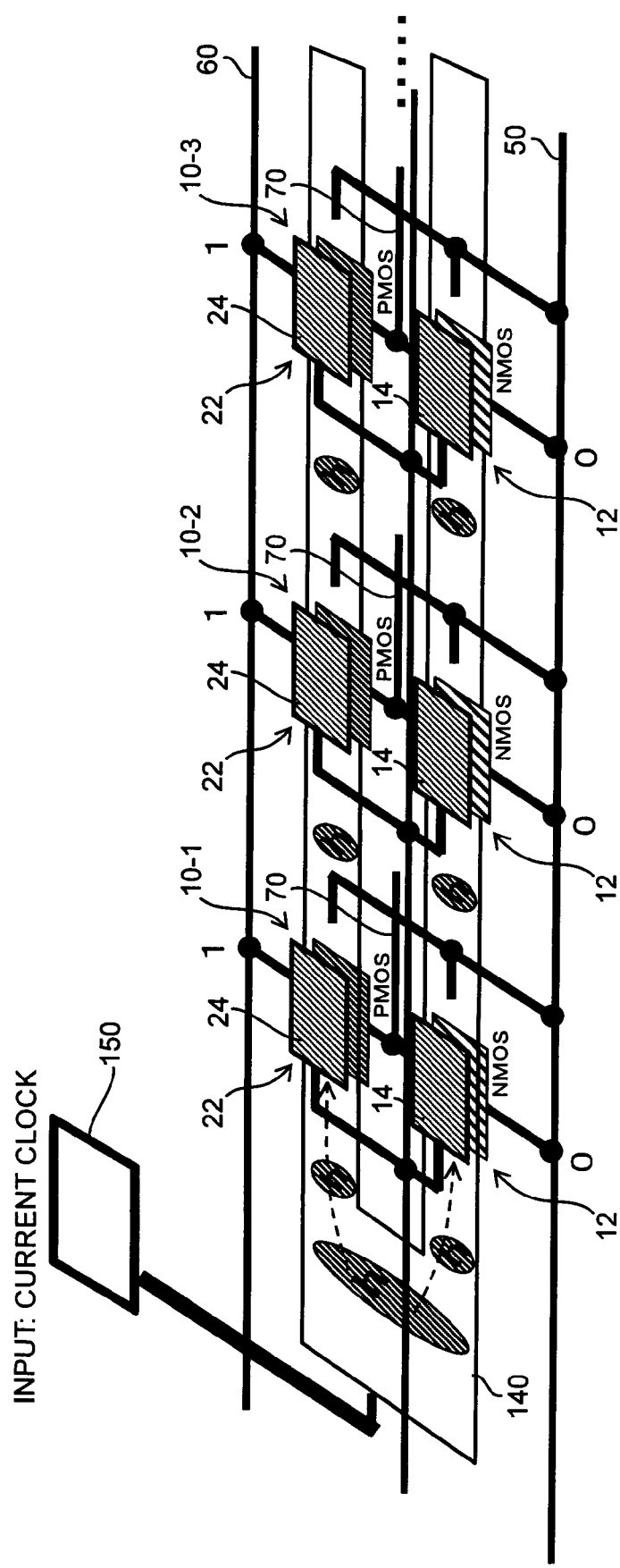
FIGS. 18 and 19 are schematic diagrams showing a variation of the embodiment.
Figure 19:
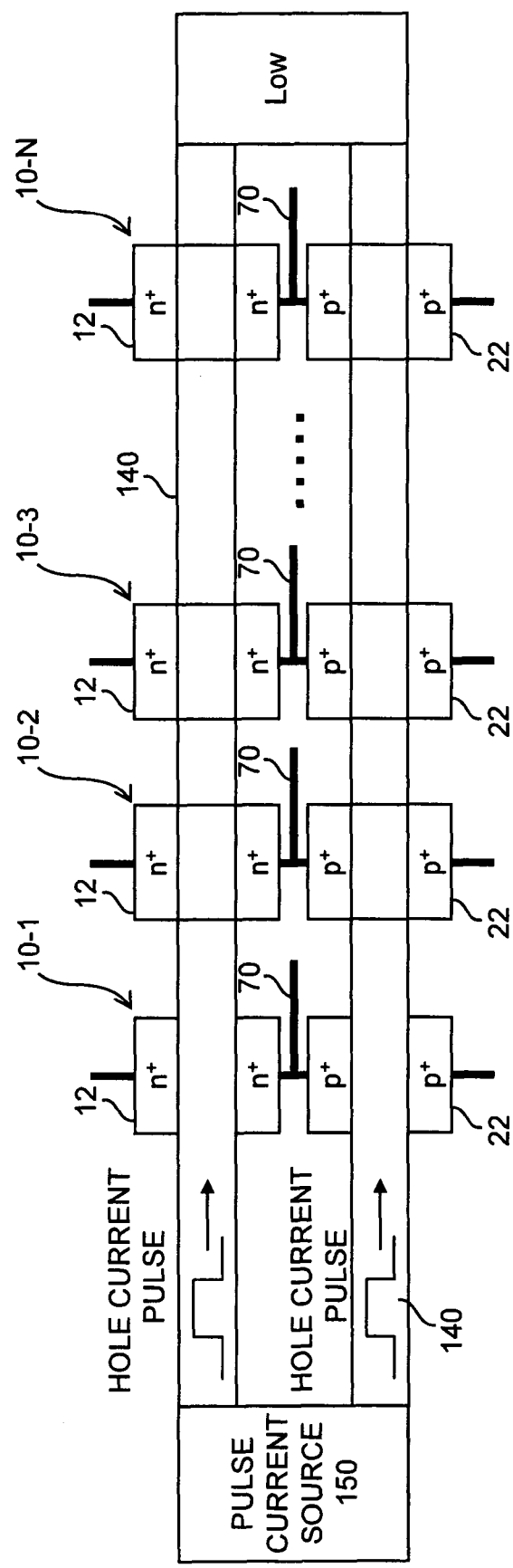

FIGS. 18 and 19 are schematic diagrams showing a variation of this embodiment.

In this variation, a common first gate 140 extends above the channels of a plurality of CMOS 10-1, 10-2, 10-3, . . . Second gates 14, 24 are provided above the first gate 140 via an insulating film. Instead of the optical waveguide 40, a pulse current source 150 is provided. The pulse current source 150 is connected to one end of the first gate 140, and the other end of the first gate 140 is connected to the low level. In this example, the first gate 140 does not need to have an optoelectric conversion function.

When a hole pulse is supplied from the pulse current source 150 to the first gate 140, the hole pulse pass through above the channels of the CMOS 10-1, 10-2, 10-3, . . . toward the low level. At this time, "0" is successively outputted from the output interconnect 70 of each CMOS. That is, this variation is also a hole transport-type semiconductor device.

The second gates 14, 24 of the CMOS 10-1, 10-2, 10-3, . . . are commonly connected to a gate interconnect 80 and provided with a low-level potential. Hence, when no hole pulse is supplied to the first gate 140, "1" is outputted from the output interconnect 70 of each CMOS as described above with reference to FIGS. 1 and 2.

Thus an inverter output in response to the current pulse from the pulse current source 150 is obtained from the output interconnect 70 of each CMOS. It is possible to synchronize a plurality of circuits by supplying the voltage clock signals obtained from these output interconnects 70 to the plurality of circuits. In this example, the first gate 140 can be formed from conductive material such as metal or silicide because it does not need to have an optoelectric conversion function.

This variation also achieves the above-described effect of reducing power consumption by providing a plurality of CMOS. More specifically, when the number of CMOS, N, is larger than 2, the power consumption can be decreased relative to the conventional current-driven CMOS. In the case of 100 percent quantum efficiency, the power consumption per CMOS is half that of the conventional current-driven CMOS for the number of CMOS, N, equal to 4, ¼ for N equal to 8, and ⅒ for N equal to 20.

Figure 20:
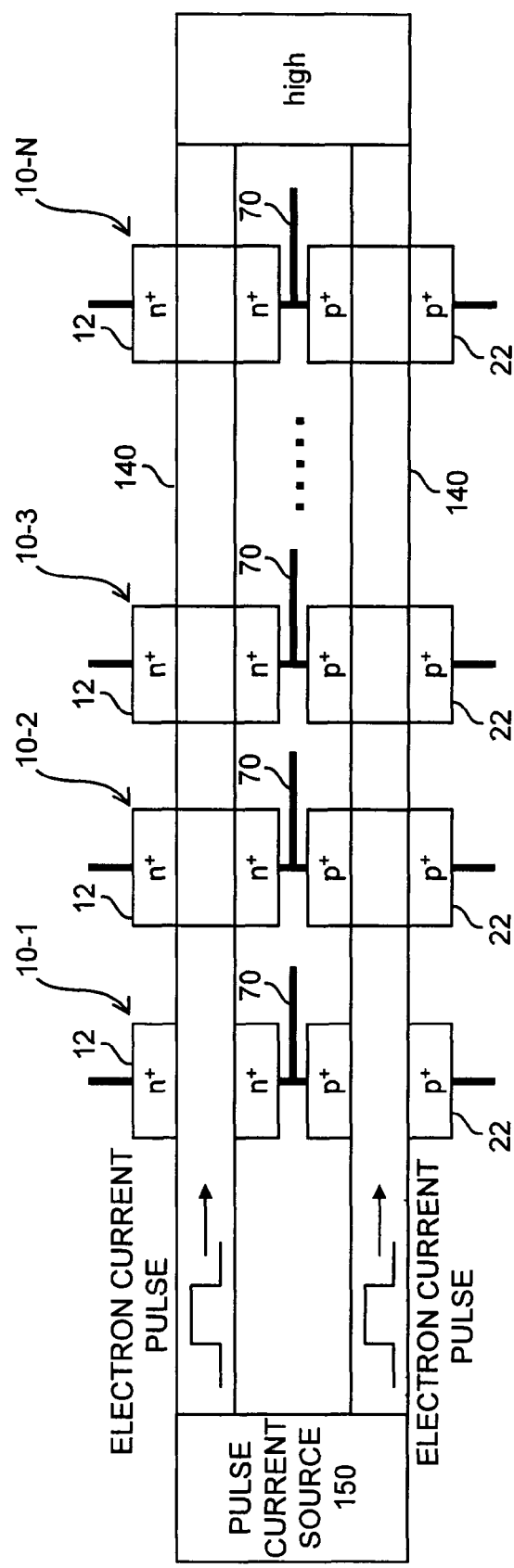
FIG. 20 is a schematic diagram showing another variation of this embodiment.

FIG. 20 is a schematic diagram showing another variation of this embodiment.

More specifically, this variation has a structure of an electron transport-type semiconductor device provided with a pulse current source 150. An electron current pulse is supplied from the pulse current source 150 to the first gate 140. In response to the travel of electrons in the first gate 140, "1" is outputted from the output interconnect 70 of each CMOS. Also in this variation, the CMOS 10-1, 10-2, 10-3, . . . are provided with second gates 14, 24 (see FIG. 18), which are provided with a high-level potential. Hence, when no electron pulse is supplied to the first gate 140, "0" is outputted from the output interconnect 70 of each CMOS as described above with reference to FIGS. 4 and 5.

Thus a voltage pulse in response to the electron pulse supplied from the pulse current source 150 is obtained from the output interconnect 70 of each CMOS. It is possible to synchronize a plurality of circuits by supplying the voltage clock signals obtained from these output interconnects 70 to the plurality of circuits. Also in this example, the first gate 140 can be formed from conductive material such as metal or silicide because it does not need to have an optoelectric conversion function.

This variation also achieves the above-described effect of reducing power consumption by providing a plurality of CMOS. More specifically, when the number of CMOS, N, is larger than 2, the power consumption can be decreased relative to the conventional current-driven CMOS. In the case of 100 percent quantum efficiency, the power consumption per CMOS is half that of the conventional current-driven CMOS for the number of CMOS, N, equal to 4, ¼ for N equal to 8, and ⅒ for N equal to 20.

The embodiments of the invention have been described with reference to examples. However, the invention is not limited to the above examples. For instance, two or more elements included in the examples described above with reference to FIGS. 1 to 20 may be combined as long as technically feasible, and such combinations are also encompassed within the scope of the invention.

The structure, shape, material, positional relationship, and number of the elements in each example can be suitably modified, and such modifications are also encompassed within the scope of the invention. Furthermore, the invention can be practiced in various other modifications without departing from the spirit thereof, and such modifications are all encompassed within the scope of the invention.

The invention claimed is:

1. A semiconductor device, comprising:
an n-type MOS transistor and a p-type MOS transistor connected in series; and
a first gate extending via an insulating film above a channel of the n-type MOS transistor and a channel of the p-type MOS transistor, the first gate being made of a material in which electrons and holes are generated by providing light, one end of the first gate being connected to a high-level interconnect, the other end of the first gate being connected to a low-level interconnect, the channels of the n-type and the p-type MOS transistors being provided between the one end and the other end,
by providing the light to the first gate, the electrons and the holes being generated, at least one of either of the electrons and the holes passing through the first gate above the channel of the n-type MOS transistor and the at least one of either of the electrons and holes passing through above the channel of the p-type MOS transistor, whereby the n-type MOS transistor and the p-type MOS transistor are switched, the at least one of either of the electrons and the holes being absorbed by one of the high-level interconnect and the low-level interconnect after passing through above the channels of the n-type and the p-type MOS transistors.

2. The semiconductor device according to claim 1, further comprising:
an optical waveguide configured to provide the light to the first gate.

3. The semiconductor device according to claim 2, further comprising:
an optical clock supply configured to supply an optical clock to the optical waveguide.

4. The semiconductor device according to claim 1, further comprising:
an n-type semiconductor region connected between the one end of the first gate and the high-level interconnect; and
a p-type semiconductor region connected between the other end of the first gate and the low-level interconnect, wherein the first gate is depleted when a high potential is applied to the n-type semiconductor region and a low potential is applied to the p-type semiconductor region.

5. The semiconductor device according to claim 1, wherein the one end of the first gate is placed at a high potential, and the other end of the first gate is placed at a low potential, and during a travel from the high potential side toward the low potential side through the first gate, a hole passes through above the channels of the n-type MOS transistor and the p-type MOS transistor.

6. The semiconductor device according to claim 5, further comprising:
a second gate configured to provide a low-level gate potential to the channels of the n-type MOS transistor and the p-type MOS transistor.

7. The semiconductor device according to claim 1, wherein the one end of the first gate is placed at a high potential, and the other end of the first gate is placed at a low potential, and during a travel from the low potential side toward the high potential side through the first gate, an electron passes through above the channels of the n-type MOS transistor and the p-type MOS transistor.

8. The semiconductor device according to claim 7, further comprising:
a second gate configured to provide a high-level gate potential to the channels of the n-type MOS transistor and the p-type MOS transistor.

9. The semiconductor device according to claim 1, further comprising:
a voltage output line connected to a junction between the n-type MOS transistor and the p-type MOS transistor connected in series.

10. A semiconductor device, comprising:
a plurality of transistor pairs, each transistor pair including an n-type MOS transistor and a p-type MOS transistor connected in series; and
a first gate extending via an insulating film above channels of the n-type MOS transistors and channels of the p-type MOS transistors of the plurality of transistor pairs, one end of the first gate being connected to a current pulse source, the other end of the first gate being connected to one of a high-level interconnect and a low-level interconnect, the channels of the n-type and the p-type MOS transistors being provided between the one end and the other end, by providing a current pulse to the first gate from the current pulse source, one of an electron and a hole passing through the first gate above the channels of the n-type MOS transistors and the one of the electron and the hole passing through above the channels of the p-type MOS transistors of the plurality of transistor pairs, whereby the n-type MOS transistors and the p-type MOS transistors are successively switched, the one of the electron and the hole being absorbed by the one of the high-level interconnect and the low-level interconnect after passing through above the channels of the n-type and the p-type MOS transistors.

11. The semiconductor device according to claim 10, wherein the one end of the first gate is placed at a high potential, and the other end of the first gate is placed at a low potential, and during a travel from the high potential side toward the low potential side through the first gate, the hole passes through above the channel of the n-type MOS transistor and the p-type MOS transistor.

12. The semiconductor device according to claim 11, further comprising:

a second gate configured to provide a low-level gate potential to the channels of the n-type MOS transistor and the p-type MOS transistor.

13. The semiconductor device according to claim 10, wherein the one end of the first gate is placed at a high potential, and the other end of the first gate is placed at a low potential, and during a travel from the low potential side toward the high potential side through the first gate, the electron passes through above the channels of the n-type MOS transistor and the p-type MOS transistor.

14. The semiconductor device according to claim 13, further comprising:

a second gate configured to provide a high-level gate potential to the channels of the n-type MOS transistor and the p-type MOS transistor.

15. The semiconductor device according to claim 10, further comprising:

a voltage output line connected to a junction between the n-type MOS transistor and the p-type MOS transistor connected in series.

* * * * *